US006077404A

United States Patent [19]

Wang et al.

[11] Patent Number: 6,077,404

[45] Date of Patent: Jun. 20, 2000

[54] REFLOW CHAMBER AND PROCESS

[75] Inventors: Hougong Wang, Cupertino; Steve Lai, Sunnyvale; Gongda Yao, Fremont; Peijun Ding, San Jose, all of Calif.

[73] Assignee: Applied Material, Inc., Santa Clara, Calif.

[21] Appl. No.: 09/024,530

[22] Filed: Feb. 17, 1998

[51] Int. Cl.[7] .......... C23C 14/34

[52] U.S. Cl. .......... 204/192.15; 204/192.12; 204/298.11; 204/298.15

[58] Field of Search .......... 204/192.12, 192.15, 204/298.09, 298.11, 298.13, 298.15; 118/721, 725; 438/760; 427/300, 375

[56] References Cited

U.S. PATENT DOCUMENTS

| | | | |
|---|---|---|---|
| 3,625,019 | 12/1971 | Osterstrom | 62/55.5 |
| 3,892,650 | 7/1975 | Cuomo et al. | 204/192 |
| 3,924,967 | 12/1975 | Harra | 417/51 |
| 4,062,319 | 12/1977 | Roth et al. | 118/49.1 |
| 4,137,012 | 1/1979 | della Porta et al. | 417/51 |
| 4,255,465 | 3/1981 | Bernard et al. | 427/62 |
| 4,379,832 | 4/1983 | Dalal et al. | 430/315 |
| 4,631,002 | 12/1986 | Pierini | 417/49 |
| 4,733,631 | 3/1988 | Boyarsky et al. | 118/719 |
| 4,843,029 | 6/1989 | Joyce et al. | 437/82 |
| 4,873,833 | 10/1989 | Pfeiffer et al. | 62/55.5 |
| 4,910,965 | 3/1990 | Lepofsky et al. | 62/55.5 |

(List continued on next page.)

FOREIGN PATENT DOCUMENTS

| | | | |
|---|---|---|---|
| 0 600 423 A1 | 6/1994 | European Pat. Off. | H01L 21/90 |
| 693626 | 1/1996 | European Pat. Off. | F04B 37/08 |
| 0 866 498 A2 | 9/1998 | European Pat. Off. | H01L 21/768 |
| 2 511 709 | 2/1983 | France | C30B 23/02 |
| 58-117371 | 12/1981 | Japan | F04B 37/16 |
| 58-117372 | 7/1983 | Japan | F04B 37/16 |
| 60-222572 | 7/1985 | Japan | F04B 37/08 |
| 62-113876 | 5/1987 | Japan | F04B 37/08 |
| 07161661 | 6/1995 | Japan | H01L 21/285 |
| 2 120 278 | 11/1983 | United Kingdom | C23G 5/00 |

OTHER PUBLICATIONS

M.N. Webster et al., "Al reflow studies for deep–submicron structures: properties and microstructure", Microelectronic Engineering 37/38, pp. 313–318 (1997).

Solid State Technology, Jul. 1983, USA, vol. 26, No. 7, ISSN 0038–11X, pp. 39–40, 'System Grows Complex Single Crystal Materials'.

Proceedings of 32$^{ND}$ Nat'l Symposium of the American Vacuum Society, Houston, TX, USA, Nov. 19–22, 1985, Journal of Vacuum Science & Technology A (Vacuuum, Surfaces, and Films), May–Jun. 1986, USA, Ueda S et al 'A High Performance Molecular Beam Epitaxy System Equipped with the Automatic Substrate Transport Mechanism', pp. 602–605.

(List continued on next page.)

*Primary Examiner*—Nam Nguyen
*Assistant Examiner*—Steven H. Ver Steeg
*Attorney, Agent, or Firm*—Dugan & Dugan

[57] ABSTRACT

A method and apparatus for reflowing a material layer is provided. The inventive method introduces into a reflow chamber a material which is at least as reactive or more reactive than a material to be reflowed (i.e., a gettering material). Preferably the gettering material is sputter deposited within the reflow chamber while a shield prevents the gettering material from reaching the material layer to be reflowed. The shield may be coupled to, or integral with a clamp for clamping a wafer (containing the material layer to be reflowed) to a wafer support provided sufficient venting exists so that contaminants degassed from the wafer may flow to the region between the sputtering target and the shield where the contaminants can react with gettering material. The shield may have a roughened top surface (the surface that faces the sputtering target) which deters gettering material from flaking off the shield and/or the shield may have a reflective bottom surface (the surface that faces the wafer) that reflects heat to the wafer.

14 Claims, 3 Drawing Sheets

U.S. PATENT DOCUMENTS

| | | | |
|---|---|---|---|
| 5,019,233 | 5/1991 | Blake et al. | 204/192.12 |
| 5,039,657 | 8/1991 | Goldman et al. | 505/1 |
| 5,135,634 | 8/1992 | Clarke | 204/298.06 |
| 5,154,582 | 10/1992 | Danielson | 417/51 |
| 5,161,955 | 11/1992 | Danielson et al. | 417/51 |
| 5,171,412 | 12/1992 | Talieh et al. | 204/192.15 |
| 5,320,496 | 6/1994 | Manini et al. | 417/51 |
| 5,357,760 | 10/1994 | Higham | 62/55.5 |
| 5,370,739 | 12/1994 | Foster et al. | 118/725 |
| 5,520,784 | 5/1996 | Ward | 204/192.15 |
| 5,622,565 | 4/1997 | Ye et al. | 118/723 R |
| 5,716,869 | 2/1998 | Hibino et al. | 437/188 |
| 5,778,682 | 7/1998 | Ouellet | 62/55.5 |

OTHER PUBLICATIONS

F. Sciuccati et al., "In situ pumping with NEG (non–evaporable getters) during vacuum processing," Vacuum, vol. 38, No. 8–10, pp. 765–769 (1988).

Technical Paper TP 202, "Gettering" an Integral Part of Vacuum Technology, Dr. Paolo della Porta— SAES Getters S.p.A., Presented at American Vaccum Society, Nov. 9–13, 1992, SAES getters.

Briesacher et al., Ultra Clean Technology, vol. 1, No. 1 pp. 49–57, 1990, "Non–Evaporable Getter Pumps For Semiconductor Processing Equipment".

Briesacher et al., "Applications for Non–Evaporable Getter Pumps For Semiconductor Processing Equipment," Presented at $10^{th}$ Symposium on ULSI Ultra Clean Technology, Kyoiku Kaikan, Nov. 1989.

SAES getters, SORB–AC Getter Wafer Modules and Panels.

REFLOW CHAMBER AND PROCESS

BACKGROUND OF THE INVENTION

Thin film deposition is essential to the manufacture of solid state electronic devices. By layering various materials (i.e., films) on a wafer in a prescribed pattern, a solid state electronic device is formed.

Within the semiconductor device industry there is an ever present trend for more complex multi-layer structures and smaller device dimensions. In order to reduce the lateral device area of storage capacitors, for example, high aspect ratio (i.e., high depth to width ratio) features (e.g., steps, trenches and vias) have become prevalent. Such features possess large side wall surface areas which allow lateral device dimensions to shrink while maintaining constant capacitor area (and thus a constant capacitance).

When depositing a film over a high aspect ratio feature, material tends to deposit near the top surface (i.e. the surface nearest the deposition material source or target) of the feature and to prevent subsequently deposited material from reaching the feature's lower surfaces, causing variations in deposition layer thickness including voids (areas containing no deposition material). Accordingly, much attention has been directed to formation of continuous conformal films within high aspect ratio features, and/or to continuous filling of high aspect ratio features (e.g., aluminum planarization).

As described in "Aluminum Planarization for Advanced Via Applications," *European Semiconductor*, February 1996, a preferred technique for achieving aluminum planarization is known as the high temperature flow process (i.e., reflow). Aluminum reflow typically begins with deposition of a thick film of aluminum that is deposited on a wafer at relatively low wafer temperatures (e.g., less than 150° C.). The wafer is then transferred to a reflow chamber and heated to a temperature at which the aluminum film flows (i.e., a reflow temperature). A temperature of 570° C. is conventionally required to supply aluminum with sufficient energy to cause the aluminum to flow. At this temperature solid phase diffusion and surface tension transport aluminum across the wafer's surface, and transport aluminum from the top region of surface features to the bottom of surface features (i.e., top down filling).

Although conventional reflow methods can produce adequate filling of many types of surface features, reflow is unfeasible for small feature applications. Thus, for small feature applications a more costly and time consuming process known as cold/hot sequential deposition (having wafer temperatures in the range of 430–475° C.) must be employed.

Moreover, both conventional reflow and cold/hot sequential deposition processes experience degraded film properties caused by contaminants (water vapor, $O_2$, etc.) which desorb from chamber surfaces, from process kit parts, or from the wafer itself during the planarization process. These contaminants enter the chamber atmosphere and are pumped therefrom. Over time fewer contaminants desorb, however, water is often the last contaminant to desorb, and can break into hydrogen and oxygen. Free oxygen is highly reactive and tends to bond with the film (e.g., aluminum) causing the film to surface passivate (e.g., tying up dangling bonds and reducing the surface energy of the film). Surface passivation degrades the film's ability to flow (i.e., degrades surface mobility), thus encouraging void formation. In addition to degrading surface mobility of the film, oxygen and hydrogen, because they have very low atomic weights, are extremely difficult to pump from the chamber. These contaminants remain in the chamber, producing an increase in chamber base pressure which causes the film to have poor crystal orientation and film purity. The poor crystal orientation and film purity result in resistivity and reflectivity deterioration. Thus contaminants which desorb from processed wafers can increase chamber base pressure, and consequently, cause incomplete feature filling due to decreased surface mobility.

Accordingly, a need exists for an expeditious and cost effective method and apparatus for planarizing films at relatively low temperatures, and for a method which resists the adverse affects of desorbed contaminants.

SUMMARY OF THE INVENTION

The present invention provides an improved reflow method and apparatus that significantly improves film quality, and reduces chamber downtime. Specifically, the inventive reflow process comprises introducing, into a reflow chamber, a material which is at least as reactive as the material of the film to be reflowed (i.e., the reflow material). For convenience a material that is at least as reactive as the reflow material is referred to herein as a gettering material.

Preferably the gettering material is sputter deposited while an object (e.g., a wafer) having a reflow material film thereon is shielded from gettering material deposition. The reflow material film is heated and reflows at a lower temperature (as compared to conventional reflow temperatures) because the surface mobility of the film is not degraded since desorbed contaminants react with the gettering material (which deposits on chamber surfaces, on process kit parts, and/or is present in the chamber's atmosphere), rather than reacting with the reflow material film. Preferably sputtering of the gettering material occurs during film heating and before contaminant desorption. However, gettering material may be deposited at anytime during the reflow process as long as it does not interfere with the deposited film being reflowed and/or, alternatively may be deposited on the chamber surfaces and on the process kit parts prior to introducing the wafer to the chamber.

Contaminants which desorb from the wafer, the film, the process kit parts and/or from chamber surfaces tend to react with the gettering material rather than with the reflow material for the following reasons:

1) because the surface area of gettering material within the chamber (e.g., chamber and process kit part surfaces coated with gettering material) is much greater than the surface area of the reflow material film;
2) because the gettering material present in the chamber's atmosphere is in a more energetic state (e.g., a plasma state) and is therefore more likely to react than the solid phase reflow material; and/or
3) because the gettering material (e.g., titanium) whether in a solid, liquid or gas phase is preferably more reactive than the reflow material (e.g., aluminum).

Thus with use of the present invention the film absorbs fewer, if any, contaminants. Film reflow is more effective and superior surface feature filling is achieved. Because contaminants react with the gettering material rather than remaining in the chamber's atmosphere, the inventive reflow chamber experiences a lower rate of rise in pressure during reflow than do conventional reflow chambers. A lower chamber pressure is therefore maintained during the inventive reflow process and causes the reflowed film to exhibit improved characteristics as compared to conventionally reflowed films (e.g., smoother surface, greater wafer to wafer sheet resistance/surface resistivity uniformity, etc.).

Finally, following an idle period, a chamber that employs the inventive reflow process can be pumped down from sputtering pressure to its base pressure faster (e.g., in as little as two minutes, depending on the pump rate) than chamber's that employ conventional reflow processes. Faster pump down is possible because the gettering material deposited on the process kit parts and on the chamber's surfaces absorbs airborne contaminants, reducing the number of airborne contaminants that need to be pumped from the chamber's atmosphere in order to return the chamber to its base pressure. Additionally, gettering material in the chamber's atmosphere reacts with airborne contaminants to produce larger molecules which are more easily pumped from the chamber. In fact, following an idle period the inventive reflow process reduces downtime by more than an order of magnitude, allowing significant throughput increases as compared to conventional reflow methods. Additional throughput increases are achieved as fewer chamber cleanings and fewer cryopump regenerations are required because contaminants are absorbed by the gettering material rather than filling the cryopump.

An inventive reflow chamber for performing the above described method comprises a source of gettering material (e.g., a target of aluminum, titanium, etc., assuming an aluminum reflow material), and a shield that blocks the gettering material from depositing on a wafer positioned within the reflow chamber. Preferably the shield is coupled or is integral to a reflector that reflects heat to the wafer. The shield may also be coupled or integral to a wafer clamping mechanism (e.g., a clamp ring or clamping fingers, etc.) provided sufficient venting exists so that degassed contaminants can flow from the wafer into the chamber's atmosphere where they can react with gettering material. Preferably the shield has a roughened top surface to deter flaking of the gettering material.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
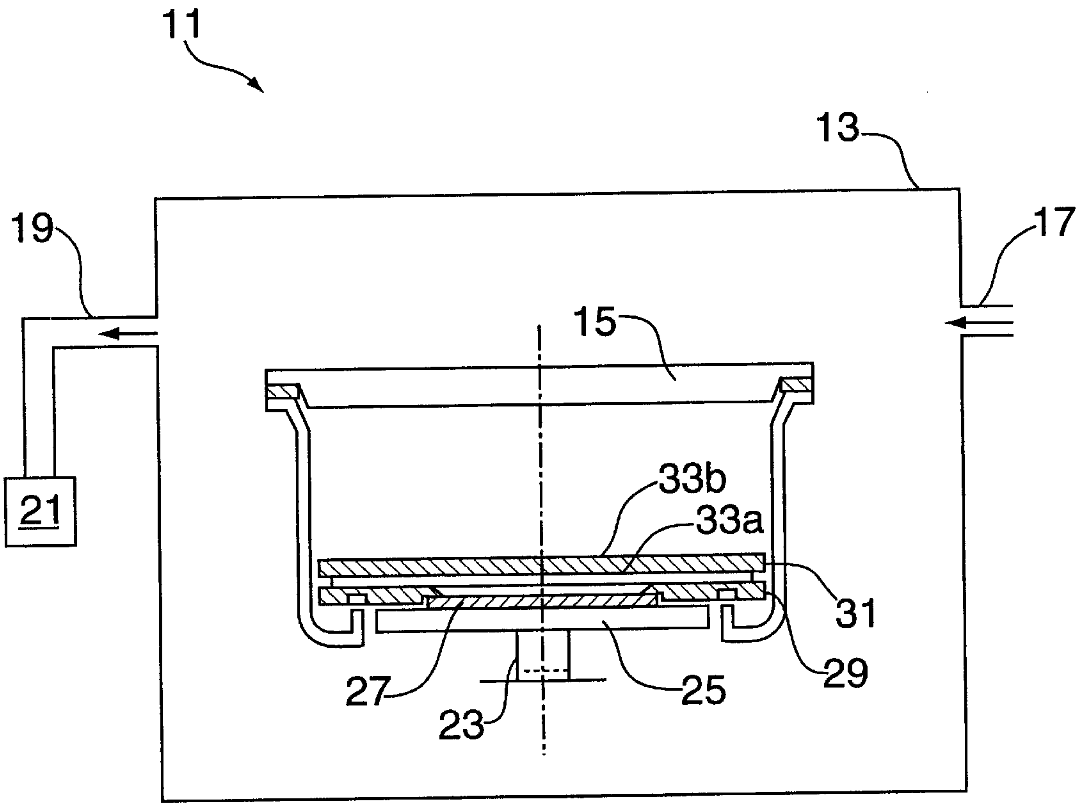
FIG. 1 is a schematic side elevational view of an inventive reflow chamber.

FIG. 1 is a schematic side elevational view of an inventive reflow chamber 11. The inventive reflow chamber 11 comprises an enclosure wall 13, which encloses a source of gettering material such as a target 15 mounted in the upper region of the reflow chamber 11. A gas inlet 17 supplies gas to the reflow chamber 11 for sputtering the target 15 (as described below), and an exhaust outlet 19, coupled to an exhaust pump such as a cryopump 21, pumps gas from the reflow chamber 11. Objects to be processed are placed on an object location (for example, on a wafer support 23) positioned below the target 15. The wafer support 23 contains a heater 25 for heating an object placed thereon.

As shown in FIG. 1 a wafer 27 is positioned on the wafer support 23 and is clamped in place by a clamp 29 which is operatively coupled to the wafer support 23. In the embodiment of FIG. 1, a shield 31 is coupled to the clamp 29. The shield 31 has a first surface which is preferably reflective (i.e., a reflective surface 33*a*), and a second surface which is preferably rough (i.e., a rough surface 33*b*). The shield 31 is coupled to the clamp 29 such that the reflective surface 33*a* faces the wafer 27 and such that the rough surface 33*b* faces the target 15. In this manner, radiative heat which emits from the wafer support 23 reflects off the reflective surface 33*a* back to the wafer 27 positioned on the wafer support 23, heated gas molecules rising from the wafer 27 are pumped away from the region between the shield 31 and the wafer 27 and gettering material sputtered from the target 15 which deposits on the rough surface 33*b* adheres thereto. Due to the rough texture of the surface 33*b*, the surface area on which gettering material may deposit is increased and gettering material that deposits on the rough surface 33*b* is less likely to crumble therefrom.

The clamp 29 may comprise any conventional clamping mechanism, for example, a ring shaped clamp or a plurality of clamping fingers, provided sufficient venting allows gasses/contaminants which desorb from the wafer 27 to flow into the region between the target 15 and the shield 31, where the gasses/contaminants may react with gettering material.

Figure 2A:
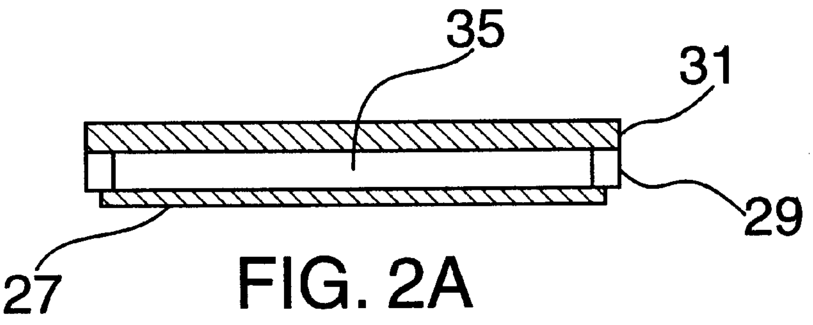
FIGS. 2A and 2B are a side elevational view and a bottom plan view, respectively, of a shield which is integral to a ring shaped clamp.
Figure 2B:
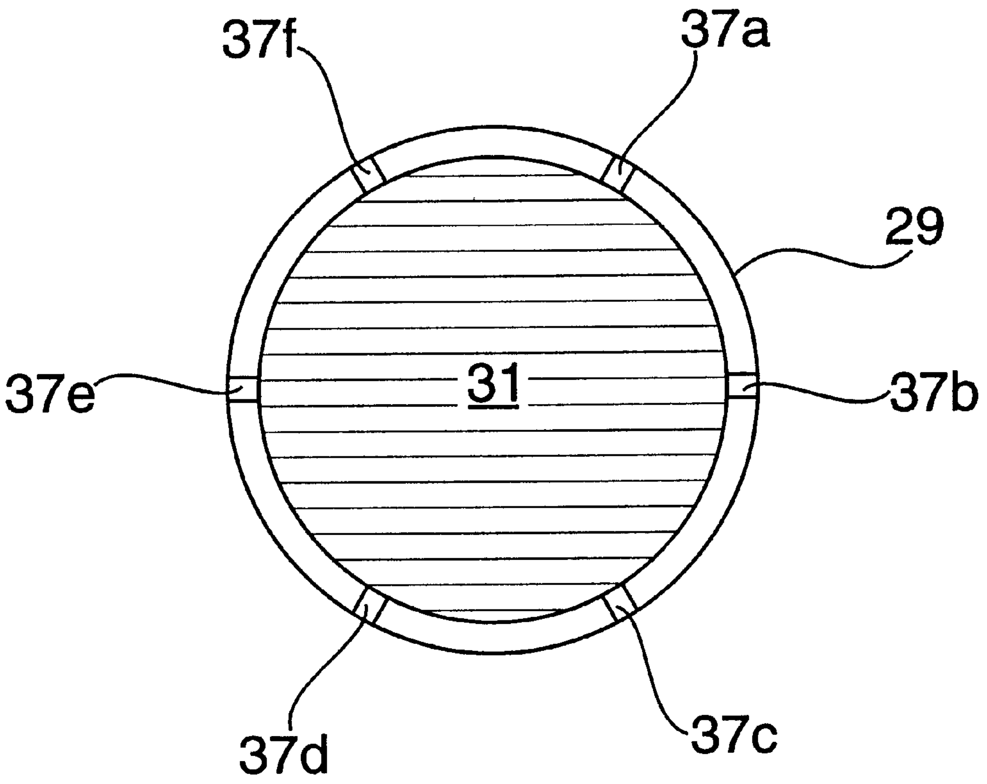

FIGS. 2A and 2B show a side elevational view and a bottom plan view, respectively, of a shield 31 which is integral to a ring shaped clamp 29. FIG. 2A shows the clamp 29 clamping a wafer 27. A region 35 is enclosed by the shield 31, the clamp 29, and the wafer 27. FIG. 2B shows six grooves 37*a–f* in the bottom surface of the clamp 29 which form channels for venting desorbed contaminants from the region 35 to a region between the shield 31 and the target 15 (FIG. 1).

Figure 3:
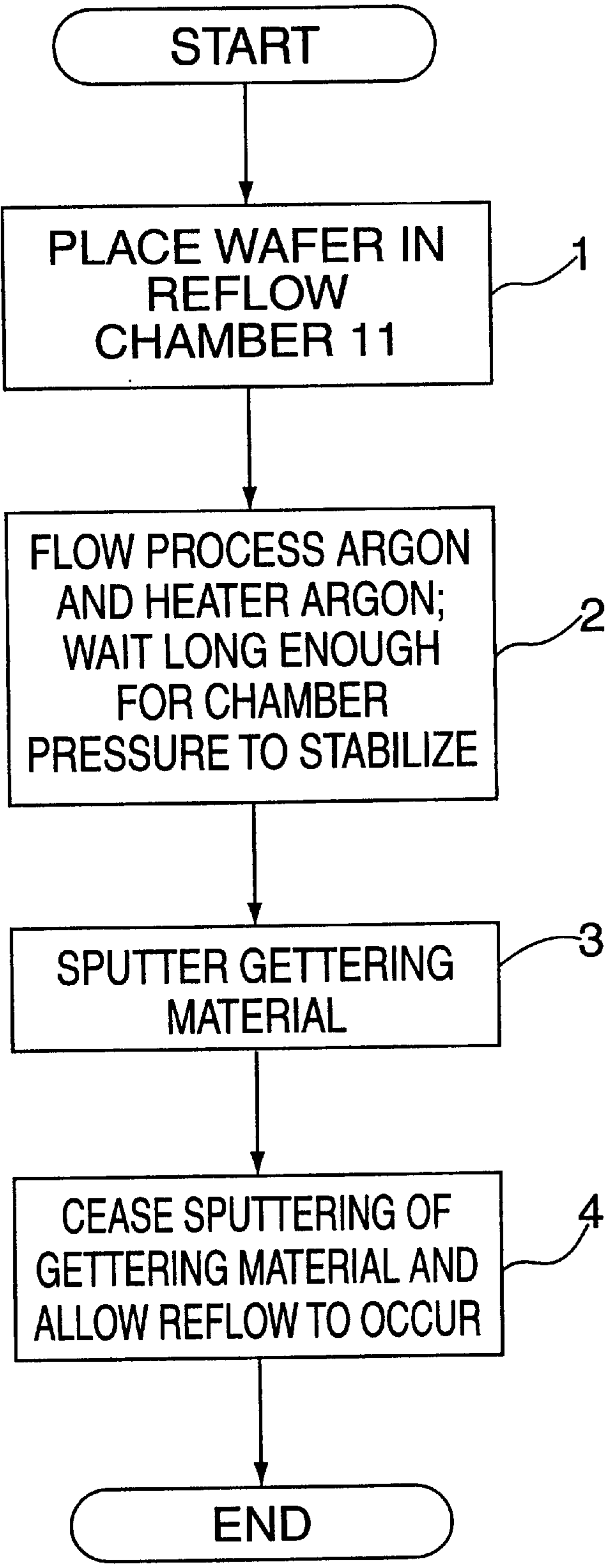
FIG. 3 is a flow diagram outlining a preferred method of operation for the inventive reflow chamber of FIG. 1.

FIG. 3 is a flow diagram useful in describing an example of the inventive reflow process. The exemplary process of FIG. 3 is described in conjunction with the apparatus of FIG. 1. As indicated by block 1, the wafer 27 is placed in the inventive reflow chamber 11 and the clamp 29, which is coupled to the shield 31, clamps the wafer 27 to the wafer support 23.

Thereafter, as represented by block 2, argon is flowed into the inventive reflow chamber 11 through the gas inlet 17 (i.e., process argon). Argon is also flowed to the region between the wafer 27 and the wafer support 23 for the purpose of conducting heat therebetween (i.e., heater argon). The heater argon flow rate is selected so that in conjunction with the heater 25 and the reflective surface 33*a*, the wafer 27 is heated to the reflow temperature.

A significant advantage of the inventive reflow process is the ability to reflow material at temperatures lower than the temperatures conventionally required for reflow. For example, for the same reflow time (e.g., 90 seconds), the present invention reflows aluminum at a heater temperature of 550° C., a significantly lower temperature than the 570° C. heater temperature required of conventional reflow methods. Reflow occurs at lower temperatures with use of the inventive reflow method because fewer contaminants react with and passivate the reflow material. Absent the inventive process, the passivating contaminants inhibit the mobility of the reflow material so that additional thermal energy must be imparted to the reflow material to achieve the required surface mobility for surface feature filling.

Assuming the material to be reflowed is aluminum, a heater temperature of 550° C., and a heater argon flow rate of 33 s.c.c. heats the wafer 27 to the 500° C. reflow temperature after 10 to 15 seconds. Prior to reaching the reflow temperature, the pressure in the reflow chamber 11 stabilizes. The temperature of the wafer and the chamber does not reach a temperature at which degassing begins until after ten seconds. Accordingly after approximately ten seconds (prior to degassing) the process proceeds to block 3.

As represented by block 3, a fresh layer of gettering material is deposited within the reflow chamber 11 by applying 1000 Watts of D.C. power to the target 15 (e.g., at a ramp rate of 550 Watts/sec). After approximately ten seconds a gettering material thickness sufficient to absorb any degassed contaminants (e.g., 60 angstroms) is deposited on the process kit parts and on chamber surfaces. Thereafter, to cease gettering material deposition the process argon and D.C. target power are turned off, as represented by block 4.

During the deposition of the gettering material, the heater power and heater argon flow remain constant such that the wafer 27 continues to heat toward the 500° C. reflow temperature. After the wafer 27 reaches the reflow temperature, the heater power and heater argon flow continue to remain constant so that the wafer 27 is maintained at the 500° C. reflow temperature. Heat radiating from the wafer 27 strikes the reflective surface 33*a* and reflects back to the wafer 27. In this manner a uniform temperature is maintained across the surface of the wafer 27 causing more uniform flow of the aluminum film across the wafer's surface and more uniform filling of surface features.

Contaminants degassed from the wafer 27, from the process kit parts and from chamber surfaces, react with the gettering material rather than with the reflow material film. Accordingly the reflow material film flows more readily at lower temperatures because the film's surface mobility is not reduced by contaminants that cause the film to surface passivate. Preferably the gettering material (e.g., titanium) is more reactive than the reflow material (e.g., aluminum). The use of titanium as the gettering material is particularly advantageous because titanium is highly soluble to contaminants (e.g., $O_2$). A layer of titanium absorbs contaminants until the entire depth of the titanium layer is contaminated (e.g., passivated). Thus, a thin layer of titanium can absorb a relatively large amount of contaminants. Accordingly, in addition to providing improved filling of surface features, the inventive reflow method is cost effective as titanium is inexpensive and is required only in small quantities.

As indicated by block 4, for an aluminum reflow material the 550° C. heater temperature is maintained for a time sufficient to allow the aluminum film to fill surface features on the wafer 27. Assuming 0.5 $\mu$m sized surface features, an 5000 angstrom aluminum film sufficiently reflows after approximately 80 seconds at a wafer temperature of 500° C.

Due to the large surface area of gettering material on the process kit parts and on chamber surfaces, the amount of gettering material in the chamber's atmosphere and/or the gettering material's permeability, a 60 angstrom gettering material layer sufficiently absorbs desorbed contaminants and no additional gettering material need be deposited during the 80 second reflow.

A conventional deposition chamber can be quickly converted to the inventive reflow chamber by providing a source of gettering material and by replacing the conventional wafer clamp with the preferred shield/clamp/reflector assembly of the present invention. During reflow the inventive reflow chamber does not experience the rapid rise in chamber pressure which plagues conventional reflow chambers. The gettering material readily absorbs contaminants, and contaminants therefore do not increase chamber pressure by remaining in the chamber's atmosphere. Accordingly, chamber base pressure remains more uniform throughout reflow processing of a given batch of wafers, and wafer properties are more uniform between the first and last wafers processed. Further, because contaminants are absorbed by the gettering material a greater number of wafers can be processed before the cryopump needs to be regenerated. Higher throughput, and reduced cost per wafer processed result.

The foregoing description discloses only the preferred embodiments of the invention, modifications of the above disclosed apparatus and method which fall within the scope of the invention will be readily apparent to those of ordinary skill in the art. For example, although the inventive process preferably employs titanium as a gettering material for use in reflow of aluminum films, other materials (including aluminum) may be employed as a gettering material. Similarly, the inventive method and apparatus are useful for the reflow of materials other than aluminum (e.g., copper, etc.). Furthermore, a fresh layer of gettering material may be deposited before the wafer is placed in the chamber.

While sputtering is the preferred method of introducing gettering material to the inventive reflow chamber, other conventional methods such as thermal evaporation or chemical vapor deposition may be employed.

Accordingly, while the present invention has been disclosed in connection with the preferred embodiments thereof, it should be understood that other embodiments may fall within the spirit and scope of the invention, as defined by the following claims.

What is claimed is:

1. A method of reflowing a material layer comprising:

placing a wafer having a first material layer thereon within a chamber;

depositing within the chamber a second material which is more reactive than the first material layer;

shielding the wafer during sputter deposition of the second material; and heating the wafer to reflow the first material layer during at least a portion of the deposition of the second material.

2. The method of claim 1 wherein the second material comprises titanium.

3. The method of claim 1 wherein heating the wafer comprises reflecting heat to the wafer.

4. The method of claim 1 wherein depositing within the chamber a second material comprises sputter depositing the second material on to at least one chamber surface.

5. The method of claim 1 wherein shielding the wafer comprises providing a shield spaced from the wafer, and thereby maintaining fluid communication between an environment of the chamber and the wafer.

6. The method of claim 1 further comprising clamping the wafer with a clamp having openings, and thereby maintaining fluid communication between an environment of the chamber and the wafer.

7. A chamber for reflowing a layer of a first material comprising:

a source of a second material that is more reactive to materials desorbed from at least one of a wafer, a process kit part, a deposited film, the first material and a chamber surface than is the first material;

a sputter deposition mechanism adapted to interact with the source of the second material so as to deposit the second material within the chamber during at least a portion of the reflowing of the layer of the first material;

an object location;

a shield operatively coupled to the object location so as to block the second material from reaching the object location during deposition of the second material; and a heater operatively coupled to the object location so as to provide heat thereto during the reflowing of the layer of the first material.

8. The chamber of claim 7 wherein the source of the second material comprises a sputtering target.

9. The chamber of claim 7 wherein the second material comprises titanium.

10. The chamber of claim 7 wherein the shield further comprises a reflector operatively coupled to the shield so as to reflect heat to the object location.

11. The chamber of claim 7 wherein the shield further comprises a surface sufficiently rough to prevent separation of the second material therefrom during subsequent reflow processes.

12. The chamber of claim 7 wherein the shield further comprises a clamp so as to hold an object in the object location.

13. The chamber of claim 12 wherein the chamber comprises an atmosphere and wherein the shield is spaced from an object under the shield so that the object maintains fluid communication with the chamber's atmosphere.

14. The chamber of claim 12 wherein the chamber comprises an atmosphere and wherein a clamp comprises openings so that an object clamped thereby maintains fluid communication with the chamber's atmosphere.

* * * * *